United States Patent
Weng et al.

[11] Patent Number: 5,985,731
[45] Date of Patent: Nov. 16, 1999

[54] METHOD FOR FORMING A SEMICONDUCTOR DEVICE HAVING A CAPACITOR STRUCTURE

[75] Inventors: Kenneth Chia-Kun Weng; Christopher Sterling Lohn; Der-Gao Lin; Kevin Yun-Kang Wu; Jeffrey D. Ganger, all of Austin, Tex.

[73] Assignee: Motorola, Inc., Schaumburg, Ill.

[21] Appl. No.: 09/135,634

[22] Filed: Aug. 17, 1998

[51] Int. Cl.⁶ .................................................. H01L 21/20
[52] U.S. Cl. ............................ 438/396; 438/250; 438/393
[58] Field of Search ..................................... 438/239, 240, 438/250, 253, 393, 396, 3

[56] References Cited

U.S. PATENT DOCUMENTS

| | | | |
|---|---|---|---|
| 4,638,400 | 1/1987 | Brown et al. ............................. | 361/304 |
| 5,065,220 | 11/1991 | Paterson et al. ......................... | 357/51 |
| 5,109,357 | 4/1992 | Eaton, Jr. .................................. | 365/145 |
| 5,119,154 | 6/1992 | Gnadinger ................................. | 357/23.6 |
| 5,185,689 | 2/1993 | Maniar ...................................... | 361/313 |
| 5,196,909 | 3/1993 | Chan et al. ................................ | 257/296 |
| 5,300,799 | 4/1994 | Nakamura et al. ....................... | 257/295 |
| 5,381,302 | 1/1995 | Sandhu et al. ............................ | 361/305 |
| 5,479,316 | 12/1995 | Smrtic et al. ............................. | 361/322 |
| 5,576,240 | 11/1996 | Radosevich et al. ..................... | 437/60 |

FOREIGN PATENT DOCUMENTS 41 07 165 A1   3/1991   Denmark .

*Primary Examiner*—Tuan H. Nguyen

[57] ABSTRACT

A method of forming a stacked capacitor structure in a semiconductor device, having metal electrode plates. After depositing the bottom electrode layer (26) and the dielectric layer (28) of the capacitor, a rough patterning step is carried out to roughly pattern or shape the bottom electrode layer and the dielectric layer, and to expose the underlying interlayer dielectric (18). A top electrode layer (32) is then blanket deposited, and another, more precise etching step is carried out to form the final shape of the capacitor element, while leaving behind a portion of the top electrode layer on the interlayer dielectric, which forms a metal interconnect (36). In one embodiment, the electrode layers are comprised of materials having a conductivity greater than doped silicon (either poly or monocrystalline), such as a metal.

18 Claims, 3 Drawing Sheets

...

METHOD FOR FORMING A SEMICONDUCTOR DEVICE HAVING A CAPACITOR STRUCTURE

FIELD OF THE INVENTION

The present invention is directed to a method for forming a semiconductor device, particularly, a semiconductor device including a stacked capacitor adapted for use in connection with analog-to-digital conversion in integrated circuits.

BACKGROUND OF THE INVENTION

As is known in the art, radio frequency (RF) and analog circuits are integrated with high-speed and high-performance digital circuits in CMOS mixed-signal applications. In this regard, conversion from analog to digital is generally done at lower base band frequencies, such as those on the order of approximately 1 MHz and lower. However, it is sought to execute the conversion from analog-to-digital at higher frequencies, such as RF to improve performance and simplify circuit design. Conversion at high frequencies requires capacitor elements that have a high quality factor (Q) and which exhibit linearity over the applied voltage ranges and over temperature ranges in which the circuit will be disposed.

Capacitors utilized in current CMOS technology do not adequately meet the needs for conversion at high frequencies. For example, typically electrodes of such capacitors are made from the bulk, monocrystaline silicon of the substrate, or polysilicon. The capacitance of such structures is dependent on two components, the insulator capacitance and the bias-dependent silicon surface depletion capacitance. As a result of the depletion capacitance associated with silicon-based electrodes, the capacitors display poor linearity.

To solve the problem of lack of linearity associated with silicon-based electrodes, electrodes may be made of a material containing metal (e.g., Ti, W), thereby limiting surface depletion capacitance. While capacitors having metal electrodes are generally known in the art, a capacitor that can be formed using current process flows has not been developed. Metal-electrode capacitors that may be fabricated with high precision, having a high "Q" are available, but require specialized process flows that are not cost effective.

Figure 1:
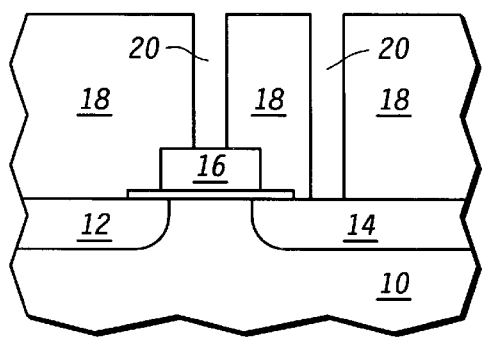
FIG. 1 illustrates a step according to an embodiment of the present invention, prior to formation of contacts.

It will be appreciated that for simplicity and clarity of illustration, elements illustrated in the figures have not necessarily been drawn to scale. For example, the dimensions of some of the elements are exaggerated relative to other elements for clarity. Further, where considered appropriate, reference numerals have been repeated among the figures to indicate corresponding or analogous elements.

DETAILED DESCRIPTION OF THE DRAWINGS

Turning to FIG. 1, a stage in the process of forming a semiconductor device according to the present invention is illustrated. As shown, semiconductor substrate 10 is depicted, having a transistor structure, including source/drain 12, source/drain 14, and gate 16 separating the source from the drain. The substrate is generally formed of doped monocrystaline silicon. However, the substrate may be polysilicon, germanium, silicon on insulator (SOI), etc. The gate 16 and source/drains 12, 14 are formed by conventional processes. Generally, a stack of layers forming gate 16 is deposited and lithographically defined and etched, and source and drains are formed by ion implant, self-aligned to the gate 16. First interlayer dielectric 18 is deposited to overlie the substrate, and openings 20 are formed therein. The interlayer dielectric 18 is formed by conventional techniques, and generally has a thickness on the order of 0.8 to 1.0 microns. The interlayer dielectric 18 is formed of silicon dioxide, but may also be formed of other dielectric materials such as borophosphosilicate glass (BPSG). The openings 20 are formed by conventional techniques, such as by plasma etching.

Figure 2:
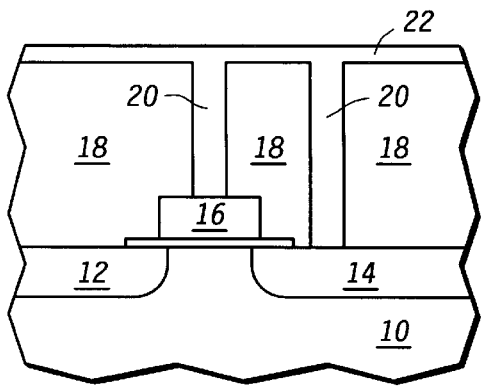
FIGS. 2 and 3 illustrate formation of contacts by deposition and polishing steps.
Figure 3:
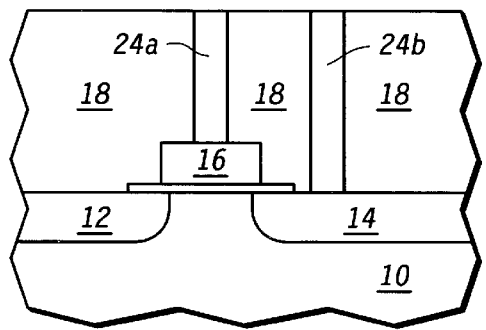

Turning to FIG. 2, a conductive layer 22 is deposited, generally formed of tungsten (W), titanium (Ti), and perhaps copper (Cu). In FIG. 3, the conductive layer 22 is then polished by chemical mechanical polishing (CMP) to planarize the layer such that contacts 24a and 24b are defined within openings 20, contacts 24 being coplanar with the top surface of first interlayer dielectric 18. Contacts 24a and 24b form conductive portions extending through the interlayer dielectric.

Figure 4:
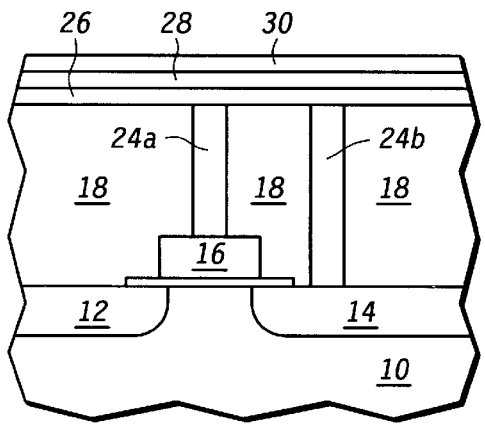
FIG. 4 illustrates formation of several layers of a capacitor element according to an embodiment of the present invention.

Following formation of the contacts 24, a plurality of layers are blanket deposited which are used to define and form a capacitor element as shown in FIG. 4. Particularly, a bottom electrode layer 26 is deposited to overlie the first interlayer dielectric 18 and the contact 24a that is connected to the gate 16. The bottom electrode layer may be formed of any conductive material, including titanium (Ti), tantalum (Ta), tungsten (W), copper (Cu), aluminum (Al), nitrides thereof and silicides thereof. It is noted that as used herein, the term "conductive layer" or "conductive material" designates the material having a resistivity lower than approximately $1 \times 10^{-5}$ ohm centimeters. Generally, doped polysilicon has a resistivity greater than $1 \times 10^{-5}$ ohm centimeters and is not generally used for the electrodes of the high Q capacitor element herein. The bottom electrode layer is formed by conventional techniques, and is generally relatively thin, on the order of 0.05 to 0.2 microns. A dielectric layer 28 is then blanket deposited to overlie bottom electrode layer 26. The dielectric layer 28 may be formed of a nitride or oxide material, such as silicon nitride, silicon oxide, or silicon oxynitride and is on the order of 0.01 to 0.06 microns in thickness. However, other dielectric materials may be used, such as BST (barium strontium titanate) materials, or BZT (barium zirconium titanate) materials. Thereafter, a thin 0.02 micron protective layer 30 is blanket deposited to overlie dielectric layer 28. The protective layer 30 is conductive to ensure electrical contact to the top electrode layer to be formed thereon, and is employed to safeguard dielectric layer 28 and bottom electrode layer 26 during a first etching step, described hereinbelow. The protective layer 30 may be formed of a nitride or silicide, for example, in one embodiment, the protective layer is formed of titanium nitride (TiN).

Figure 5:
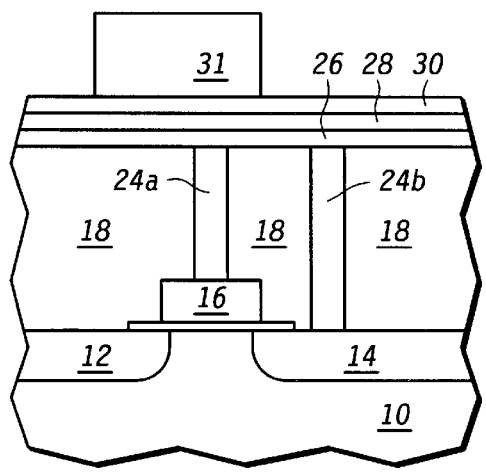
FIGS. 5 and 6 illustrate patterning of the layers depicted in FIG. 4.
Figure 6:
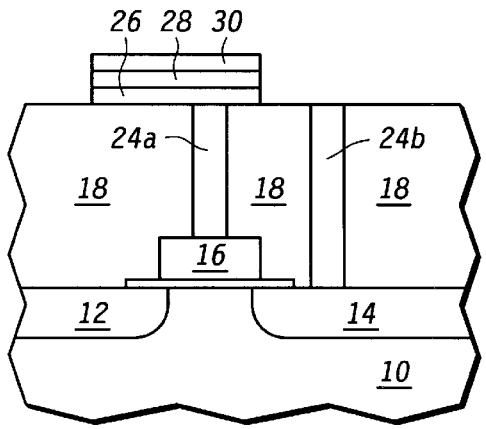

Turning to FIGS. 5 and 6, photoresist 31 is spin-coated, exposed, and developed to pattern layers 26, 28, and 30. As shown, the portion of layers 26, 28, and 30 that overlie contact 24b are removed so as to expose contact 24b. This patterning step is carried out by etching, and may be understood as a "rough" etching step, wherein layers 26, 28, and 30 will be patterned again by a second etching step to define the capacitor element.

Figure 7:
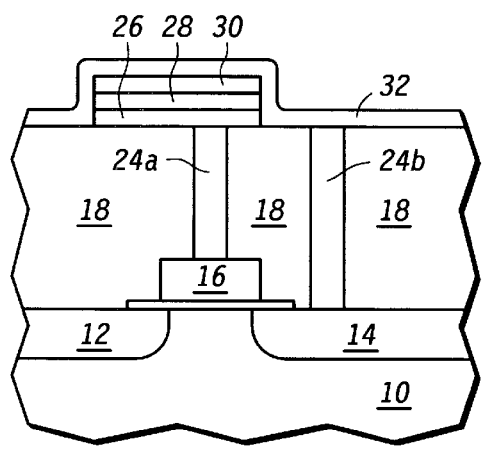
FIG. 7 illustrates deposition of a top electrode layer that has dual functions according to the present invention.

Turning to FIG. 7, a top electrode layer 32 is blanket deposited so as to overlie the stack of layers 26, 28, and 30, as well as to overlie the first interlayer dielectric 18, including contact 24b. The top electrode layer 32 contains Al or Cu, and has a nominal thickness on the order of 0.7 micron.

Figure 8:
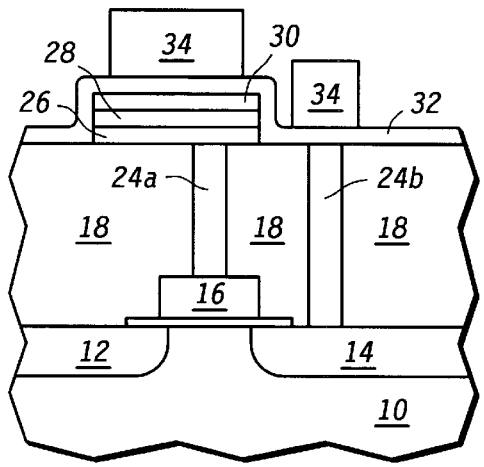
FIGS. 8 and 9 illustrate patterning of the layers to form a capacitor element and metal interconnect layer.
Figure 9:
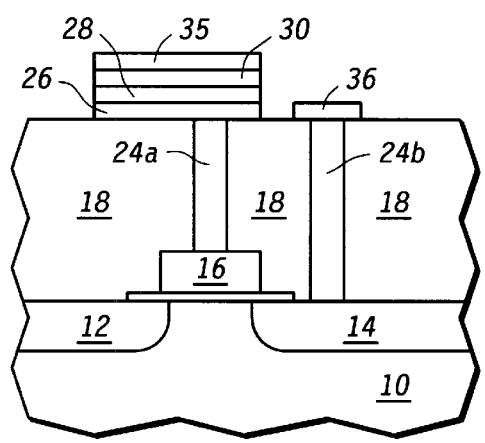
Figure 10:
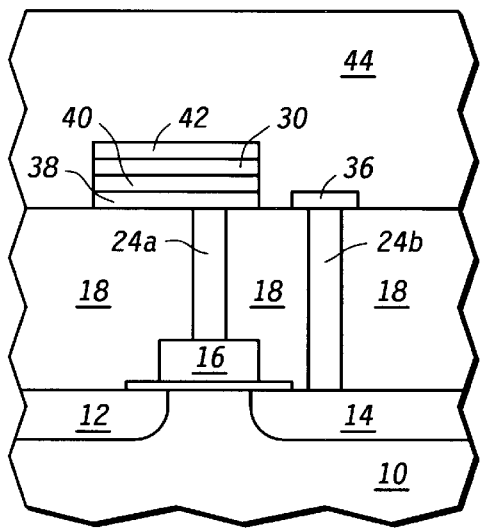
FIGS. 10–12 illustrate additional steps of forming an interlayer dielectric and vias extending therethrough for electrical contact.

As shown in FIGS. 8 and 9, the structure is again patterned via a second etching step, particularly a photoresist layer 34 is deposited so as to lithographically define the dimensions of the capacitor element or capacitor structure. The second etching step is more precise than the first in that the final dimensions of the capacitor element are defined thereby. In addition, as shown in FIG. 8, a portion of the photoresist layer 34 is left above the contact 24b. As shown in FIG. 10, following etching and removal of photoresist 34, the capacitor element is defined having bottom electrode plate 38, dielectric plate 40, protective layer 30, and top electrode plate 42. In addition, the metal layer 32 is patterned so as to leave behind metal interconnect 36, overlying and in electrical connection with contact 24b. In this way, the top electrode of the capacitor element and the first level of metal interconnects are simultaneously formed, thereby reducing the number of process steps according to this particular embodiment of the present invention. That is, separate process steps are not needed to form the top electrode of the capacitor element and the first layer of metallization forming metal interconnect 36. It is noted that the metal interconnect 36 is shown in cross section, and that it is actually a conductive trace that runs an extended length into and out of the plane of the page that interconnects other elements, such as other source/drains of other transistors.

Figure 11:
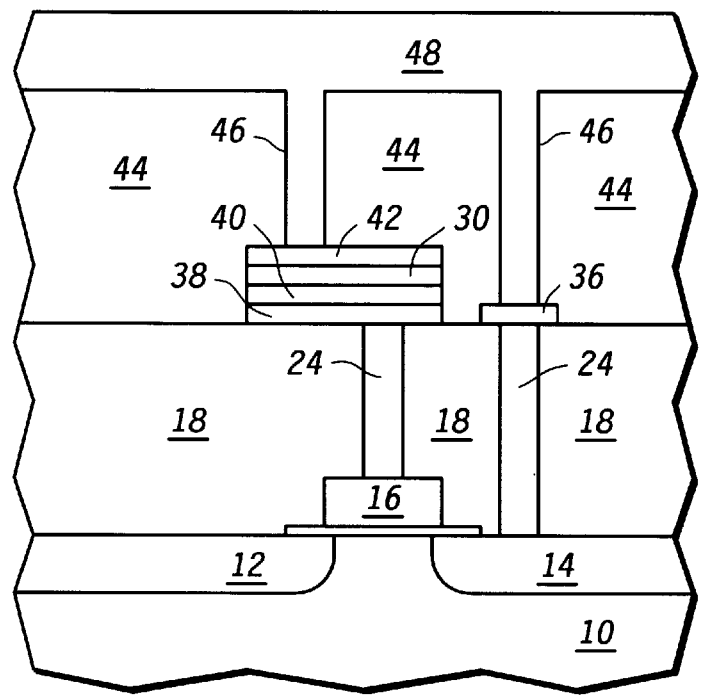
Figure 12:
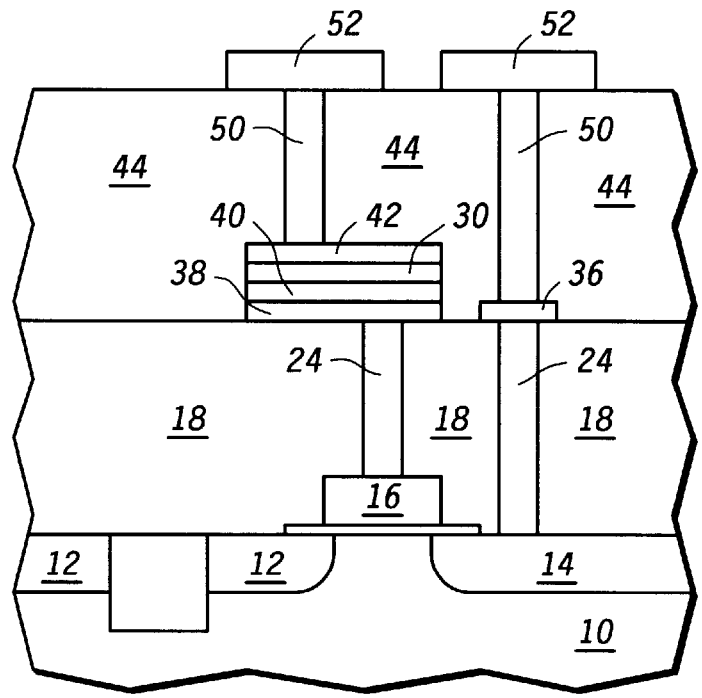

Following formation of the capacitor element and metal interconnects, a second interlayer dielectric 44 is deposited, in a similar manner to first interlayer dielectric 18, as shown in FIG. 11. Openings 46 are etched in the second interlayer dielectric 44, and metal layer 48 is deposited and polished back to define vias 50. Thereafter, a second layer of metal is deposited and patterned to form a second level of metal interconnects depicted by metal interconnects 52 as shown in FIG. 12. The device may then be completed by depositing appropriate dielectric and higher level metallization layers, followed by passivation, as is known in the art.

As disclosed herein, a novel method for forming a semiconductor device having a capacitor element has been disclosed. According to the present invention, preferably the capacitor element employs metal, rather than doped polysilicon, bottom and top electrode plates to take advantage of the high Q property of metal electrodes. In addition, the capacitor element is defined such that the electrode and dielectric layers all have the same geometry, via the second etch step described above. Accordingly, problems associated with differently sized electrode plates such as edge effects are overcome. In addition, since the top electrode and the first layer of metallization are co-formed using the same deposition and patterning steps, the process flow is simplified and may easily be incorporated in existing process flows.

While the present invention has been described herein with particular detail with respect to embodiments of the present invention, it is well understood that one of ordinary skill in the art may modify the present invention without departing from the scope of the attached claims.

What is claimed is:

1. A method for forming a semiconductor device, comprising the steps of:

providing a semiconductor substrate;

forming an interlayer dielectric overlying the semiconductor substrate;

depositing a bottom electrode layer to overlie the interlayer dielectric;

depositing dielectric layer to overlie the bottom electrode layer;

selectively etching the bottom electrode layer and the dielectric layer, to partially remove the bottom electrode layer and the dielectric layer and expose a portion of the interlayer dielectric;

depositing a top electrode layer so as to overlie the dielectric layer and the interlayer dielectric; and etching the top electrode layer, the dielectric layer and the bottom electrode layer, to form a top electrode plate, a dielectric plate, and a bottom electrode plate, respectively, to form a capacitor structure, wherein during etching of the top electrode layer, at least one portion of the top electrode layer overlying the interlayer dielectric remains to define a metal interconnect.

2. The method of claim 1, further comprising steps of:

forming a second interlayer dielectric overlying the top electrode layer; and providing a via extending through the second interlayer dielectric and making electrical contact with the top electrode plate.

3. The method of claim 1, wherein the interlayer dielectric has a conductive portion, and the bottom electrode layer is deposited so as to overlie the conductive portion.

4. The method of claim 3, wherein the semiconductor substrate has a transistor structure formed therein, and the conductive portion of the interlayer dielectric is a contact extending through the interlayer dielectric and contacting the transistor structure.

5. The method of claim 4, wherein the contact is formed by:

blanket depositing a conductive layer over the interlayer dielectric, so as to fill an opening therein; and polishing the conductive layer to remove a first portion overlying the interlayer dielectric and leaving behind a second portion in the opening.

6. The method of claim 4, wherein the contact comprises at least one material selected from the group consisting of W, Ti, and Cu.

7. The method of claim 1, wherein the bottom electrode plate and the top electrode plate comprise a conductive material having a resistivity less than $1 \times 10^{-5}$ ohm cm.

8. The method of claim 7, wherein the top electrode plate comprises at least one component from a group consisting of Cu and Al.

9. The method of claim 7, wherein the bottom electrode plate comprises at least one component from a group consisting of Ti, Ta, W, Cu, and Al.

10. The method of claim 9, wherein bottom electrode plate comprises a nitride or silicide of Ti, Ta, W, Cu, or Al.

11. The method of claim 1, wherein the dielectric layer comprises at least one material from a group consisting of nitrides and oxides.

12. The method of claim 1, wherein the dielectric layer comprises at least one material from a group consisting of silicon nitride and silicon oxide.

13. The method of claim 1, further comprising forming a protective layer overlying the dielectric layer prior to the step of selectively etching, wherein the step of selectively etching etches the protective layer.

14. The method of claim 13, wherein the protective layer comprises at least one material from a group consisting of nitrides and silicides.

15. A method for forming a semiconductor device, comprising the steps of:

provid ing a semiconductor substrate;

forming an interlayer dielectric overlying the semiconductor substrate;

depositing a bottom electrode layer to overlie the interlayer dielectric;

depositing dielectric layer to overlie the bottom electrode layer;

selectively etching the bottom electrode layer and the dielectric layer, to partially remove the bottom electrode layer and the dielectric layer and expose a portion of the interlayer dielectric;

depositing a top electrode layer so as to overlie the dielectric layer and the interlayer dielectric; and etching the top electrode layer, the dielectric layer and the bottom electrode layer, to form a top electrode plate, a dielectric plate, and a bottom electrode plate to form a capacitor structure, wherein the top electrode plate and the bottom electrode plate have a resistivity less than less than $1 \times 10^{-5}$ ohm cm.

16. The method of claim 15, wherein the top electrode plate comprises a material from a group consisting of Cu and Al, and the bottom electrode plate comprises a material from a group consisting of Ti, Ta, W, Cu, Al.

17. The method of claim 16, wherein bottom electrode plate comprises a nitride or silicide of Ti, Ta, W, Cu, or Al.

18. A method for forming a semiconductor device, comprising the steps of:

providing a semiconductor substrate;

forming an interlayer dielectric overlying the semiconductor substrate, the interlayer dielectric having a first contact and a second contact extending therethrough;

depositing a bottom electrode layer to overlie the first contact and the interlayer dielectric, such that electrical connection is made between the bottom electrode layer and the first contact;

depositing dielectric layer to overlie the bottom electrode layer;

selectively etching the bottom electrode layer and the dielectric layer, to partially remove the bottom electrode layer and the dielectric layer and expose a portion of the interlayer dielectric and the second contact;

blanket depositing a top electrode layer so as to overlie the dielectric layer and the interlayer dielectric, said top electrode layer comprising a material from a group consisting of Al and Cu; and etching the top electrode layer, the dielectric layer and the bottom electrode layer, to form a top electrode plate, a dielectric plate, and a bottom electrode plate to form a capacitor structure that overlies and is in electrical connection with the first contact, wherein during etching of the top electrode layer, a portion of the top electrode layer overlying the second contact is left behind to define a metal interconnect.

* * * * *